United States Patent [19]
Brotto et al.

[11] Patent Number: 5,945,803
[45] Date of Patent: Aug. 31, 1999

[54] APPARATUS FOR DETERMINING BATTERY PACK TEMPERATURE AND IDENTITY

[75] Inventors: Daniele C. Brotto, Baltimore; Danh T. Trinh, Towson, both of Md.

[73] Assignee: Black & Decker Inc., Newark, Del.

[21] Appl. No.: 09/094,302

[22] Filed: Jun. 9, 1998

[51] Int. Cl.$^6$ .......................... H01M 10/44; H01M 10/46
[52] U.S. Cl. ......................... 320/106; 320/110; 320/150
[58] Field of Search ................................ 320/106, 110, 320/125, 128, 132, 150, DIG. 21

[56] References Cited

U.S. PATENT DOCUMENTS

| | | |
|---|---|---|
| 3,911,351 | 10/1975 | Saslow . |
| 4,006,396 | 2/1977 | Bogut . |
| 5,120,169 | 6/1992 | Russo . |
| 5,144,217 | 9/1992 | Gardner et al. . |
| 5,184,059 | 2/1993 | Patino et al. ............................ 320/125 |
| 5,325,040 | 6/1994 | Bogut et al. . |
| 5,352,969 | 10/1994 | Gilmore et al. . |
| 5,411,816 | 5/1995 | Patino . |
| 5,460,901 | 10/1995 | Syrjälä . |
| 5,489,834 | 2/1996 | Pitkanen . |
| 5,548,201 | 8/1996 | Grabon . |
| 5,874,825 | 2/1999 | Brotto ..................................... 320/150 |

FOREIGN PATENT DOCUMENTS

| | | |
|---|---|---|
| 3815001 | 11/1989 | Germany . |
| 4225686 | 3/1994 | Germany . |

*Primary Examiner*—Edward H. Tso
*Attorney, Agent, or Firm*—Harness, Dickey & Pierce, P.L.C.

[57] ABSTRACT

A battery monitor system that determines battery pack temperature and battery pack identification. The battery pack includes a battery pack circuit having a thermistor and an AC circuit component. The battery monitoring system determines the battery pack temperature by measuring the resistance of the thermistor when the battery pack circuit is in a steady-state condition, and determines the value of the AC component based on a changing or dynamic electrical condition of the battery pack circuit. In one embodiment, to determine battery pack identification, an identification capacitor is connected in circuit with the thermistor. One terminal of a comparator is switched to a low reference voltage potential once the identification capacitor has been charged, and the output of the comparator gives an indication of the discharge rate of the capacitor, and thus its identification. In an alternate embodiment, the battery monitor circuit determines the identity of the battery pack by determining whether a thermistor does or doesn't exist, and if so, whether an identification capacitor does or doesn't exist.

34 Claims, 4 Drawing Sheets

APPARATUS FOR DETERMINING BATTERY PACK TEMPERATURE AND IDENTITY

BACKGROUND OF THE INVENTION

1. Field of the Invention

This invention relates generally to a battery charger monitor that monitors battery pack parameters during charging of a battery and, more particularly, to a battery charger monitor that monitors battery voltage, battery temperature and determines battery pack identification using an identification capacitor within the battery pack, where the battery pack identification and the battery temperature are monitored on a single line between the battery monitor and the battery pack.

2. Discussion of the Related Art

Many different electrical devices, such as some power tools, cellular phones, appliances, etc., use battery packs that are rechargeable. Modern battery chargers are capable of charging battery packs having different rated voltages and different battery chemistry, i.e., nickel-cadmium, metal hydride, lithium, etc. Most of these battery chargers monitor the voltage of the battery pack during the charging process to provide a full charge without exceeding the maximum charge of the battery pack which could cause damage to the pack. U.S. Pat. Nos. 4,388,582 and 4,392,101, both issued to Sar et al., and assigned to the assignee of the present invention, disclose a quick battery charging technique which monitors the charging of a battery pack by noting inflection points in a voltage charging curve as the electrical chemical potential within the battery cells changes with respect to time. By determining specific inflection points in the charging curve, it is possible to accurately terminate the charging when the battery pack is at full charge.

In addition to monitoring the voltage of a battery pack that is being charged, the battery monitor may also determine other pieces of useful information, including battery pack temperature and battery pack identification. Monitoring battery pack temperature is useful because overheating the battery pack during charging can cause significant damage to the battery pack. Determining the battery pack identification is desirable to ascertain certain things such as maximum battery voltage and capacity, battery chemistry, manufacturing date, etc. This information can be used by a charging control algorithm controlling the charging process to aid in monitoring and adjusting the charging process.

Battery chargers and charger monitors that monitor battery voltage and battery temperature during the charging process can be found in U.S. Pat. No. 5,352,969 and U.S. patent application Ser. No. 08/834,375, filed Apr. 16, 1997, titled "Indirect Thermal Sensing System for a Battery Charger," both assigned to the assignee of the instant application. Both of these documents disclose an analog-to-digital conversion technique that converts an analog battery voltage signal to a digital representation suitable for microprocessor analysis. The battery voltage signal is attenuated by a voltage attenuation or prescaler circuit, acting as a voltage divider, to cause the battery voltage to be in a predetermined narrow range regardless of the battery voltage. The prescaler circuit allows the battery charger to effectively monitor the battery voltage for a wide range of battery packs having varying voltages. U.S. patent application Ser. No. 08/834,375 also discloses a technique for monitoring battery temperature using a similar analog-to-digital conversion method.

U.S. Pat. No. 5,489,834 issued to Pitkanen discloses a battery type and temperature identification circuit. The battery pack being charged includes a negative temperature coefficient resistor, a voltage divider resistor, and a fixed identification resistor electrically connected in a voltage divider circuit. The identification resistor is different for each different battery pack type, and provides the basis for determining battery type. An output voltage from the voltage divider circuit follows a particular curve set by the identification resistor as the temperature on the pack changes. Because the value of the identification resistor is selected based on the battery pack type, and the values of the negative temperature coefficient resistor and voltage divider resistor are selected to be the same or nearly the same for each battery type, the different voltage curves at the output of the voltage divider circuit for the different battery types can be spaced apart. By determining which curve the output voltage follows for changes in temperature gives an indication of the battery pack identification.

This technique does, however, suffer from a number of drawbacks and disadvantages. Particularly, because each of the voltage signals for the different battery packs are voltage divided by a particular identification resistor to be separated, the resolution of the voltage signal is low, and distinction between one voltage curve to a next voltage curve could provide error because of curve overlap. Because one voltage curve for one battery pack type is adjacent to another battery pack type, it may be impossible to tell whether the voltage representation is at the end of one voltage curve or at the beginning of a next voltage curve. Additionally, because the battery type identification circuit must have accurate resolution within the range of each voltage curve as well as over the entire range of the voltage curves combined, a very expensive analog-to-digital converter is required.

German Patent Application No. DE 42 25 686 A1, published Mar. 3, 1994 discloses a circuit for recognizing and charging a battery pack, where the battery pack includes a temperature dependent resistor and an identification capacitor. A microprocessor applies a DC voltage signal to the battery pack to determine the resistive value of the temperature dependent resistor. Next, a square wave signal is applied to the battery pack, and the impedance is measured. The value of the identification capacitor is then determined by the equation $Z=1/(sqr(1/R)^2+(1/Xc)^2)$ to identify the battery pack.

What is needed is a battery charger monitor circuit that is able to charge a battery pack in the charger, monitor the voltage of the battery, monitor the temperature of the battery, and provide an indication of the battery pack identification in and efficient and cost effective manner, and doesn't suffer the drawbacks of the prior art devices discussed above. It is therefore, an object of the present invention to provide such a battery monitor circuit.

SUMMARY OF THE INVENTION

In accordance with the teachings of the present invention, a battery monitor is disclosed that uses a thermistor in combination with an AC circuit component, such as a capacitor or an inductor, to determine battery pack temperature and battery pack identification. To determine the battery pack temperature, the resistance of the thermistor is measured when the battery pack circuit is in a steady-state condition. Next, an AC signal is applied to the battery pack circuit under a dynamic circuit condition to identify the AC circuit component and identify the battery pack. Thus, the temperature of the battery pack and the identification of the battery pack can be determined on a single line.

According to one embodiment, to determine the battery pack temperature in one embodiment, a first voltage divider network is provided, including a reference capacitor, where an output voltage of the first voltage divider network is applied to one terminal of a comparator. A second voltage divider network is provided that is electrically connected to the battery pack. The second voltage divider network includes a thermistor positioned within the battery pack at a location suitable to take battery pack temperature measurements, and a plurality of resistors within the battery monitor circuit. The output of the second voltage divider network is applied to another terminal of the comparator. Once the reference capacitor is charged, it is allowed to discharge through the first voltage divider network. When the reference capacitor decays below the value of the output of the second voltage divider network, the comparator switches high. Because the values of the reference capacitor and the resistors in the first voltage divider network, and the plurality of resistors in the second voltage divider network are known, the resistive value of the thermistor can be determined based on the output of the comparator. This resistive value is representative of the temperature within the battery pack.

According to one embodiment, the second voltage divider network and the comparator are also used to determine battery pack identification. An unknown identification capacitor that has a value unique to a particular battery pack is included in the battery pack, and is connected in circuit with the thermistor and the second voltage divider network. The battery monitor circuit can determine the capacitance value of the identification capacitor based on its discharge rate. One terminal of the comparator is switched to a low reference voltage potential once the identification capacitor has been charged and is at a steady state. The second voltage divider network includes a low value resistor that allows the identification capacitor to be quickly discharged. Once the voltage potential of the second divider network applied to the positive terminal of the comparator falls below the reference potential, the monitor can determine the value of the capacitor based on the known value of the resistances.

In another embodiment, the identification of the battery pack is determined by whether a thermistor and a capacitor exist in the battery pack circuit. To determine whether the thermistor is in the battery pack circuit, a voltage output of a voltage divider network is measured. If the measurement indicates that the thermistor does exist, then the voltage measurement is used to determine the resistance of the thermistor. To determine whether the capacitor exists in the battery pack circuit, the capacitor is first discharged, assuming that it does exist. Next, charging of the capacitor is initiated, and after a predetermined period of time, a voltage output of the battery pack circuit is measured to determine whether it is above or below a predetermined threshold value. If it is above the threshold value, then the capacitor does not exist, and if it is below the threshold the capacitor does exist.

Other advantages and objects of the present invention will become apparent to those skilled in the art from the subsequent detailed description, appended claims and drawings.

DETAILED DESCRIPTION OF THE PREFERRED EMBODIMENTS

The following discussion of the preferred embodiments directed to a system for measuring battery temperature and determining battery pack identification in a battery charger is merely exemplary in nature, and is in no way intended to limit the invention or its applications or uses.

Figure 1:
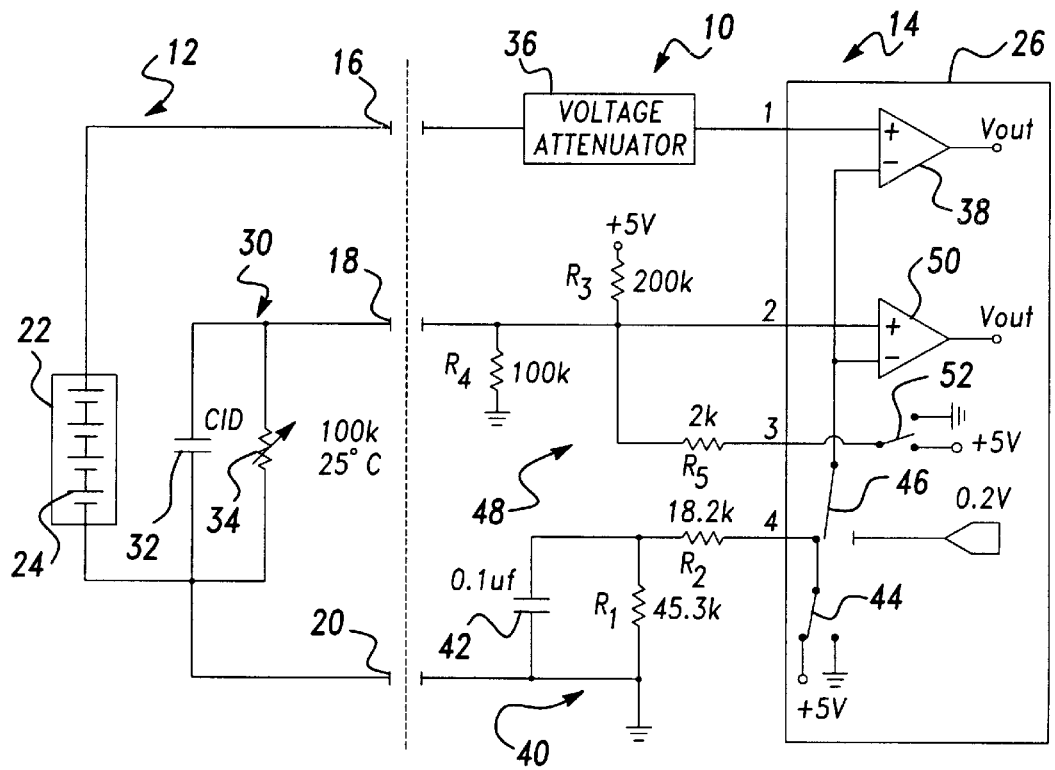
FIG. 1 is a circuit diagram of a battery pack monitoring circuit that determines battery pack voltage temperature and identity according to an embodiment of the present invention.

FIG. 1 shows a schematic diagram of a battery monitoring circuit 10 that is separated into a battery pack side 12 and a battery charger side 14, according to an embodiment of the present invention. The battery pack side 12 is electrically connected to the battery charger side 14 at three connections 16, 18 and 20, as shown. The battery monitor circuit 10 is used to monitor a battery pack 22 including a plurality of battery cells 24. The battery monitoring circuit 10 provides three major functions, including monitoring the charging process of the battery pack 22, determining the temperature of the battery pack 22, and identifying the battery pack 22. The connection 16 connects a battery pack voltage measuring and charging line, the connection 18 connects a battery pack temperature and battery pack identification line, and the connection 20 provides a ground connection. Although not specifically shown, it will be understood that the battery monitoring circuit 10 will include battery charging circuitry in association with the monitoring circuitry on the battery charger side 14. The battery pack identification can provide various desirable information, including battery chemistry, such as nickel cadmium, metal hydride, lithium, etc., number of cells 14, manufacturing date, rated voltage, etc.

The battery monitoring circuit 10 is microprocessor controlled by a microprocessor 26. The microprocessor 26 can be any suitable microprocessor for the purposes described herein, and as will be well understood by those in the art, many different microprocessors are available for this purpose. Four of the microprocessor pins are labeled 1, 2, 3 and 4 for purposes of the discussion herein. However, these pins will have different pin numbers depending on which microprocessor is used. As will be discussed in greater detail below, the battery pack temperature and the battery pack identification are both determined from a single connection at pin 2.

The battery pack side 12 includes a battery pack circuit 30 in electrical connection with the battery pack 22. The battery pack circuit 30 includes an identification capacitor 32 and a thermistor 34. The thermistor 34 is a variable resistor that changes its resistance based on temperature, as is well understood in the art. Other types of temperature sensing devices may be applicable within the scope of the present invention, as would be appreciated by those skilled in the art. The identification capacitor 32 is specially selected to identify the battery pack 22, and thus has a different capacitive value depending upon the pack 22. The thermistor 34 is strategically placed within the battery pack 22 so as to provide a temperature reading of the pack 22. Thus, everything on the battery pack side 12 is removable from the actual battery charger as a single unit, and can be replaced with other battery packs.

In accordance with the teachings of the present invention, both the temperature of the battery pack 22 and the identification of the battery pack 22 are determined through a single connection to the battery charger side 14, here connection 18. The temperature of the battery pack 22 is measured when the battery pack circuit 30 is in a steady-state condition, where a DC signal is applied through the connection 18. To determine the identification of the battery pack 22, the battery pack circuit 30 is put under a dynamic circuit condition to determine the value of the capacitor 32. In an alternate embodiment, the capacitor 32 can be replaced with another AC circuit component, such as an inductor.

The battery charger side 14 of the battery monitoring circuit 10 includes a voltage attenuator 36 or prescaler circuit (resistor divider network) that is used to attenuate the output voltage of the battery pack 12 to be at or near a desirable voltage output. The attenuation of the voltage attenuator 36 can be selectively set so that the desirable voltage output is nearly the same for all battery packs 22 regardless of its actual voltage. This attenuated voltage is applied to the positive terminal of a comparator 38 at pin 1 of the microprocessor 26. The charging voltage applied to the battery pack 22 is applied through the connection 16 from a current source (not shown) to charge the battery pack 22.

The battery charger side 14 of the battery monitor circuit 10 further includes an RC circuit 40. The RC circuit 40 includes a reference capacitor 42 having a known value, and resistors $R_1$ and $R_2$ also having known values that make up a voltage divider network within the circuit 40. The output voltage of the RC circuit 40 is applied to pin 4 of the microprocessor 26. When the microprocessor 26 switches a switch 44 to a suitable reference potential, here a plus five volt potential, the capacitor 42 is charged through the resistor $R_2$. After the capacitor 42 has been charged and is at steady state, the switch 44 is switched to a high impedance state, and the voltage of the capacitor 42 dissipates through the resistor $R_1$ at a known dissipation rate based on the values of the capacitor 42 and the resistors $R_1$ and $R_2$, This capacitor dissipation voltage is applied to the negative terminal of the comparator 38 through a switch 46. At the same time that the switch 44 is switched to a high impedance state, the microprocessor 26 begins counting at a predetermined clock pulse rate by an intern al timer. Once the voltage potential of the capacitor 42 falls below the attenuated voltage of the battery pack 12, the output $V_{out}$ of the comparator 38 goes high, and the microprocessor 26 stores the number of counts.

By programming the microprocessor 26 with the values of the capacitor 42, the resistors $R_1$ and $R_2$, and the selected attenuation value of the voltage attenuator 36, the discharge of the capacitor 42 will be known, and thus the voltage of the battery pack 22 can be converted to a digital signal. A more detailed discussion of an analog-to-digital conversion of a voltage potential as just described can be found in U.S. Pat. No. 5,352,969 and U.S. patent application Ser. No. 08/834, 375, mentioned above. For the purposes of the present invention, monitoring of the battery voltage in this manner is not necessary, and can be done by various techniques.

Figure 2:
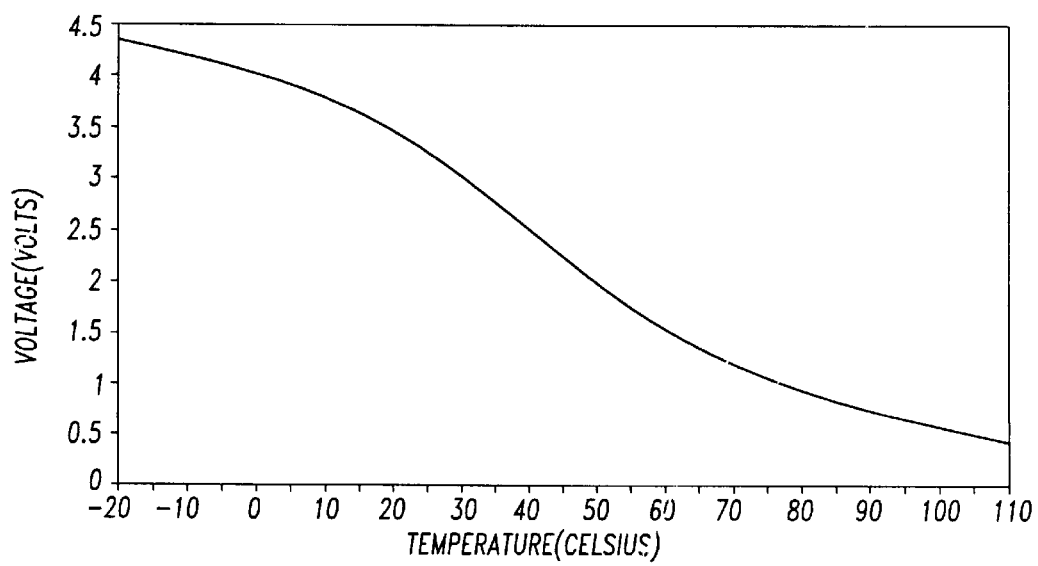
FIG. 2 is a graph of a voltage divider output of the circuit shown in FIG. 1 having temperature on the horizontal axis and voltage on the vertical axis.

Resistors $R_3$, $R_4$ and $R_5$ and the thermistor 34 make up a voltage divider network 48. To determine the temperature of the battery pack 22, the switch 44 is connected to the five volt reference potential to charge the capacitor 42, and pins 2 and 3 are set to a high impedance input state, i.e., open, so that the identification capacitor 32 on the battery pack side 12 is charged through the resistor $R_3$. In this configuration, the thermistor 34 and the resistor $R_4$ are connected in parallel, and combine with the resistor $R_3$ to form the voltage divider network 48. The output of the voltage divider network 48 at pin 2 is now a function of the temperature of the battery pack 22. A graph of this voltage divider output is shown in FIG. 2, where the voltage output at pin 2 is on the vertical axis and temperature is on the horizontal axis. As is apparent, as the temperature increases, the resistance of the thermistor 34 goes down and the voltage divider output at pin 2 decreases.

Figure 3:
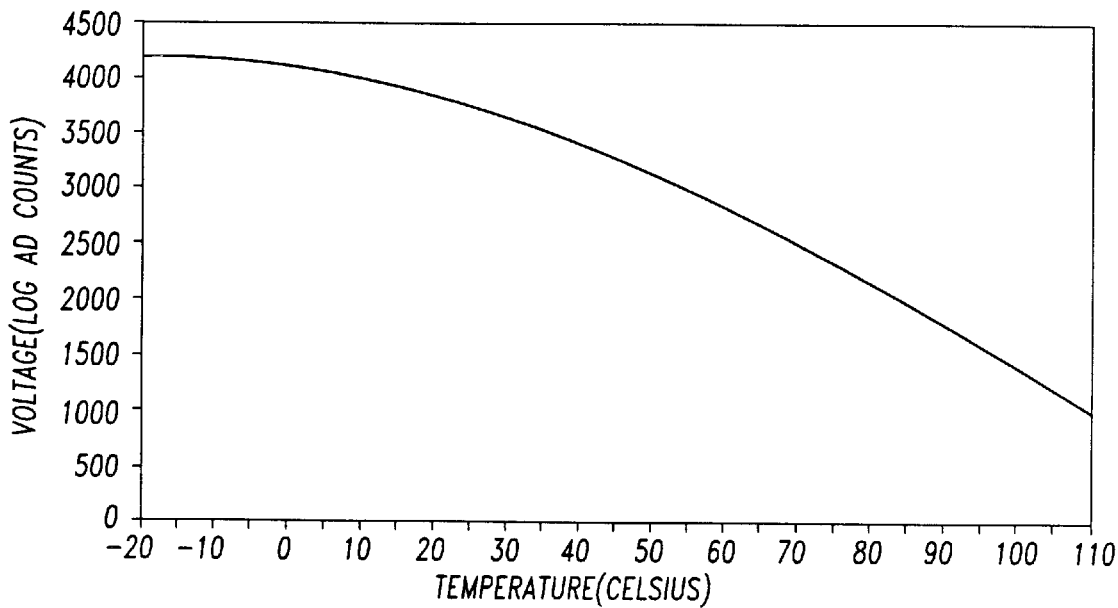
FIG. 3 is a graph of the log A/D timer counts as a function of temperature with voltage on the vertical axis and temperature on the horizontal axis.

The analog voltage divider output at pin 2 is applied to the positive terminal of a comparator 50. The voltage signal from the RC circuit 40 is applied to pin 4 of the microprocessor 26, which in turn is applied to the negative input terminal of the comparator 50 through the switch 46. After the capacitor 42 is charged, and the switch 44 is switched to a high impedance state, the capacitor 42 begins to discharge, and the microprocessor 26 begins to count clock pulses. When the capacitor dissipation voltage at pin 4 drops below the voltage divider output signal of the circuit 48 at pin 2, the comparator 50 switches high and the microprocessor 26 stores the count pulse as a digital conversion. This count pulse is a digital representation of the temperature. A technique for measuring temperature of a battery pack, and converting it to a digital representation in this manner is discussed in U.S. patent application Ser. No. 08/834,375. FIG. 3 is a graph showing the voltage divider output at pin 2 in Log AD counts on the vertical axis and temperature on the horizontal axis. As is apparent, as the temperature goes up, the resistance of the thermistor goes down, the voltage output goes down and the digital count decreases.

The comparators 38 and 50 and the switches 44 and 46 are shown internal to the microprocessor 26. This configuration is shown by way of a non-limiting example in that these components can be external to the microprocessor 26, and the outputs of the comparators 38 and 50 can be applied as inputs to the microprocessor 26. Further, the comparison between the various signals discussed above, and switching of the switches can be performed in software by programming the microprocessor 26. The depiction shown in FIG. 1 is solely intended to give an understanding of the basic operation of the monitoring circuit 10 of the invention.

In accordance with the teachings of the present invention, the identification of the battery pack 22 is also determined at pin 2 of the microprocessor 26. To accomplish this, pin 2 is set to a high impedance input state and pin 3 is set to a high output state by switching a switch 52 to a +5 volt potential. In this configuration, the thermistor 34 and the resistor $R_4$ are in parallel, and the resistor $R_3$ and $R_5$ are in parallel in the voltage divider circuit 48. The capacitor 32 is charged through the voltage divider circuit 48 by the high output state potential applied to the resistor $R_3$ and $R_5$. A low reference voltage, here 0.2 volts, is applied to the negative terminal of the comparator 50 through the switch 46, and an internal timer of the microprocessor 26 is initialized.

Once the voltage across the capacitor 32 reaches steady state, the capacitor 32 is discharged by setting pin 3 to a low output state by switching the switch 52 to ground and the internal timer is started. The charging and discharging of the capacitor 32 provides a changing or dynamic circuit electrical condition. Because the resistor $R_5$ has a much lower value than the thermistor 34 and the resistors $R_3$ and $R_4$, the capacitor 32 discharges quickly through the resistor $R_5$. Thus, the changing resistance of the thermistor 34 as the temperature changes does not have a significant effect on the discharge rate of the capacitor 32. In this example, the resistor $R_5$ has a value that is two magnitudes lower than the resistors $R_3$ and $R_4$ to provide this quick discharge. However, this is by way of a non-limiting example in that other values may be applicable for different designs.

When the voltage at pin 2 from the discharge of the capacitor 32 falls below the 0.2 reference voltage, the comparator 50 switches high, and the timed count is stored. This count value represents a voltage discharge time of the capacitor 32. Because the values of $R_3$, $R_4$, $R_5$ and the thermistor 34 are known, the value of the capacitor 32 can be determined based on its discharge rate. Because different values for different capacitors will have different discharge times for the same resistor values, by inserting a known capacitor in association with the battery pack 22, the battery pack 22 can be identified.

Figure 4:
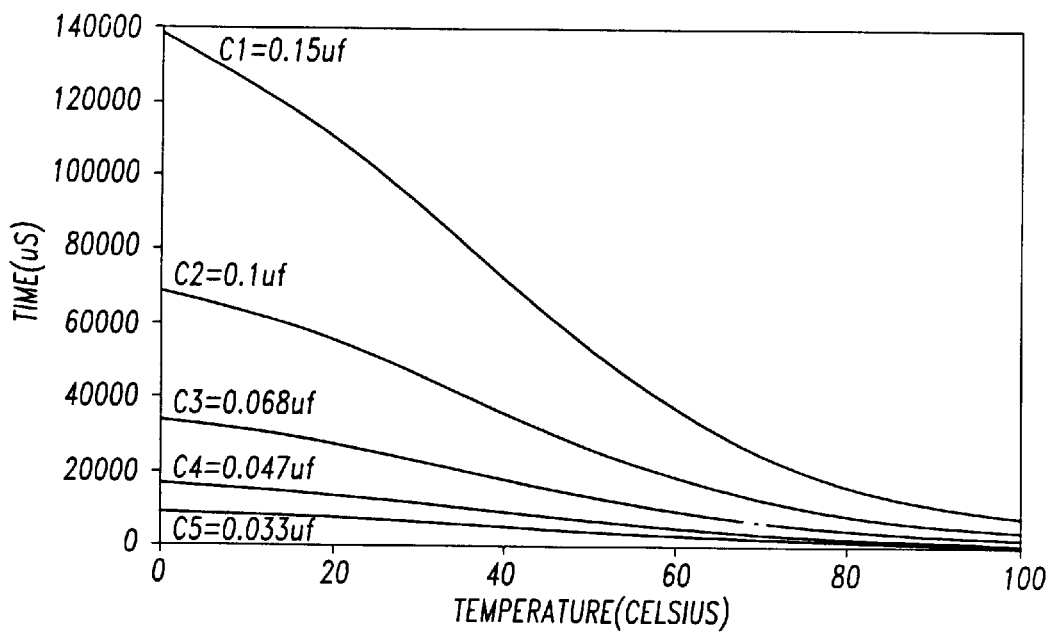
FIG. 4 is a graph of the decay times of the identification capacitor with time on the vertical axis and temperature on the horizontal axis.
Figure 5:
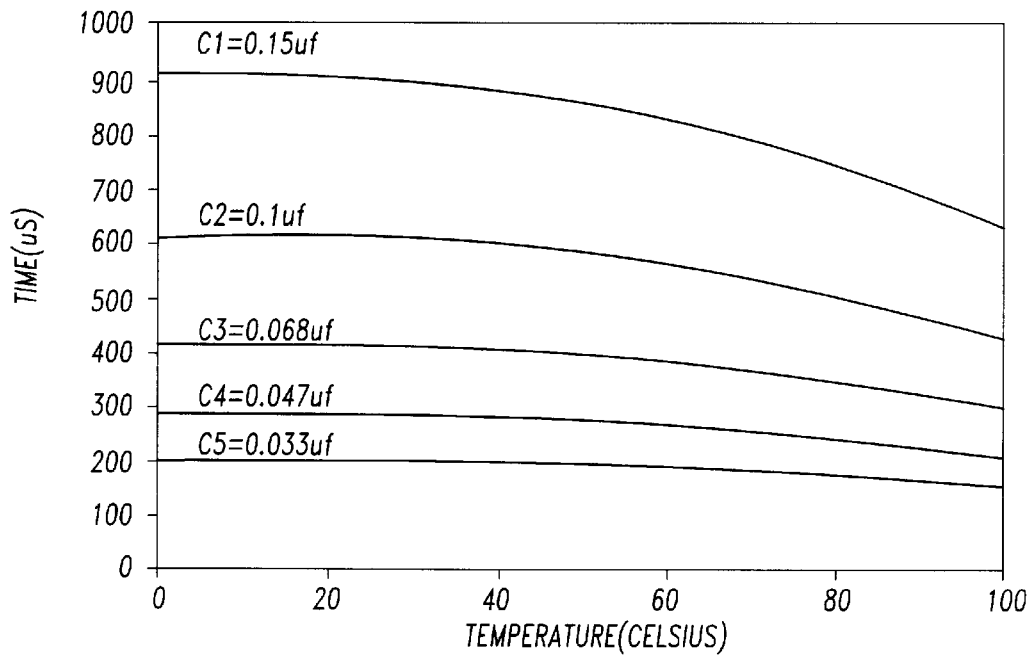
FIG. 5 is a graph of the decay time of the identification capacitor with time on the vertical axis and temperature on the horizontal axis.

The values of the resistors $R_3$ and $R_4$ and the thermistor 34 are selected so that the voltage drop across the thermistor 34 falls within the common mode input voltage range of the comparator 50 and within the predicted temperature range of interest. However, these values are not optimized for measuring the voltage decay across the capacitor 32 due to a large temperature dependency. This is apparent by viewing the graph shown in FIG. 4, depicting the decay times versus temperature for different values of the capacitor 32 without the resistor $R_5$, This shows that without the lower value resistor $R_5$, the temperature change on the thermistor 34 has a great effect on the discharge time of a capacitor having different values. Without the resistor $R_5$, the process would consume a large amount of software resources when modeled as a microcontroller program, although it would work. However, the decay time temperature dependency can be dramatically reduced by the addition of the resistor $R_5$. By connecting the resistor $R_5$ to pin 3, one terminal of the resistor $R_5$ can be set high when the resistors $R_3$ and $R_5$ are in parallel, or set low when the thermistor 34 and resistors $R_4$ and $R_5$ are in parallel to dynamically alter the output of the voltage divider circuit 48. When the resistor $R_5$ is floating, the voltage divider circuit 48 is optimized for temperature readings. By making the resistor $R_5$ small in comparison to the thermistor 34, and by setting pin 3 high or low, the voltage divider circuit 48 is optimized for measuring the discharge time of the capacitor 32. Because the value of the resistor $R_5$ is small, it "overrides" the effects of the other resistances in the voltage divider circuit 48, including the thermistor 34. This fast charging and discharging through the resistor $R_5$ results in a capacitor decay time temperature independence as shown in the graph of FIG. 5.

Figure 6:
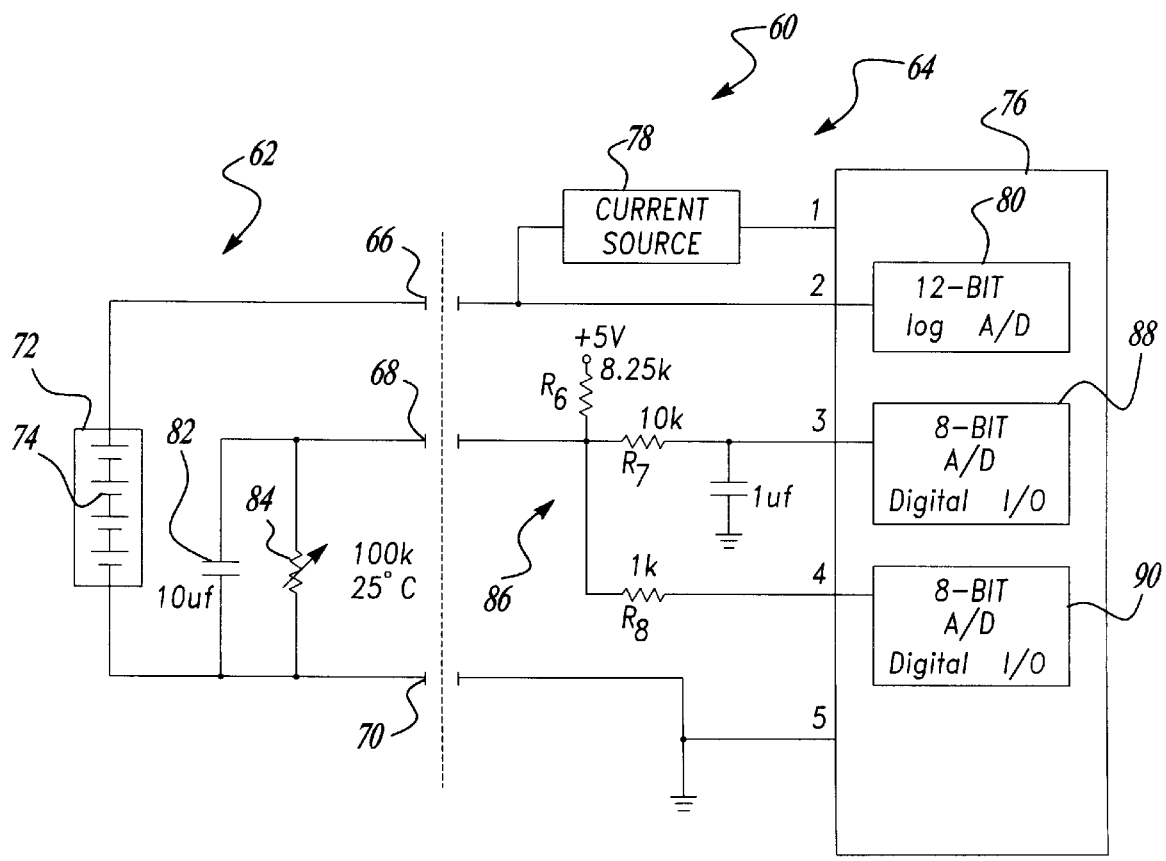
FIG. 6 is a circuit diagram of a battery pack monitoring circuit that determines battery pack temperature and identity according to another embodiment of the present invention.

Another embodiment for determining battery pack temperature and battery pack identity is also disclosed, according to the present invention, that is a simplified version of the embodiment described above. Certain battery monitoring applications may only require the identification of a limited number of battery packs than that proposed by the embodiment described above. FIG. 6 shows a schematic diagram of a battery monitoring circuit 60 that is separated into a battery pack side 62 and a battery charger side 64, according to another embodiment of the present invention. The battery pack side 62 is electrically connected to the battery charger side 64 at three separate connections 66, 68 and 70, as shown. The battery monitoring circuit 60 is used to monitor a battery pack 72 that includes a plurality of battery cells 74.

The connection 66 connects a battery pack voltage measuring and charging line, the connection 68 connects a battery pack temperature and battery pack identification line, and the connection 70 provides a ground connection.

The battery monitoring circuit 60 is microprocessor controlled by a microprocessor 76. The microprocessor 76 can be any suitable microprocessor for the purposes described herein, such as the Zilog Z86C83, known to those skilled in the art. Five of the microprocessor pins are labeled 1, 2, 3, 4 and 5 for purposes of discussion herein. However, these pins will have different pin numbers depending on which microprocessor is used.

The battery pack 72 is charged by a control signal applied to pin 1 to turn on a current source 78. The voltage of the battery pack 72 is measured at pin 2 of the microprocessor 76 using a 12-bit log A/D converter 80 in the same manner as described above. The details of the charging and charge monitoring of the battery pack 72 can be any suitable technique known in the art consistent with the battery monitoring circuit 60.

The battery pack side 62 includes an identification capacitor 82 and a thermistor 84, just as with the embodiment described above. However, in this embodiment, the monitoring circuit 60 does not identify the battery pack 72 by determining the actual capacitance of the capacitor 82, but determines the identity of the battery pack 70 by whether the capacitor 82 exists, regardless of its value, and whether the thermistor 84 exists. For certain battery packs, such as nickel cadmium battery packs, the temperature of the pack may not need to be determined, or may be determined by indirect thermal sensing or other thermal sensing techniques, and thus the thermistor 84 is not needed. Since the identification capacitor 82 only has the purpose of determining the identity of the battery pack 72, the capacitor 82 can also be eliminated. Therefore, for certain types of battery packs, both the thermistor 84 and the capacitor 82 can be eliminated. Accordingly, a first type of battery pack can be identified by determining that it does not have a thermistor or a capacitor, a second type of battery pack can be identified by determining that it has a thermistor and no capacitor, and a third type of battery pack can be identified by determining that it has both a thermistor and a capacitor.

The charger side 64 of the monitoring circuit 60 includes a circuit 86 that includes a pull-up resistor $R_6$ connected to a five volt potential and resistors $R_7$ and $R_8$ electrically connected as shown, that combine with the thermistor 84 to define a voltage divider network. In accordance with the teachings of the present invention, to determine if the thermistor 84 exists, the resistor $R_8$ is electrically removed from the circuit 86 by setting an analog/digital I/O at pin 4 of the microprocessor 76 to a high impedance. Then, the thermistor 84 and the resistor $R_6$ divide the +5 volt potential. The divided voltage is measured at pin 3 of the microprocessor 76, where the voltage is applied to an 8-bit analog/digital converter 88 that converts the voltage to a digital representation readable by the microprocessor 76. An 8-bit A/D converter is used in this embodiment because it provides a good absolute accuracy, although it has less resolution than the A/D converters identified above. Because the value of $R_6$ is known, if the thermistor 84 did not exist in the battery pack side 62, then the thermistor 84 would not act to divide the voltage. The microprocessor 76 would determine this by the value stored in the A/D converter 88. Likewise, if the thermistor 84 does exist in the battery pack side 62, a different value will be stored in the A/D converter 88. Therefore, the microprocessor 76 can identify whether the thermistor 84 exists or not.

If the thermistor 84 does exist, the monitoring circuit 60 will determine the temperature of the battery pack 72 by the resistance of the thermistor 84. Because the resistance value of the thermistor 84 will change based on the temperature of the pack 72, values stored in the A/D converter 88 will change based on the resistance value of the thermistor 84, giving an indication of the pack temperature in the manner as described above.

If the monitoring circuit determines that the thermistor does not exist in the battery pack side 62, then it is determined that the battery pack 72 is a particular battery pack type, such as a nickel cadmium battery pack. If the monitoring circuit 60 determines that the thermistor 84 does exist in the battery pack side 62, it will then determine if the thermistor 84 has a value that falls within a certain range. If the resistive value of the thermistor 84 is within the range, the circuit 60 then determines whether the capacitor 82 does or doesn't exist. First, pin 4 is set as an output low to discharge the capacitor 82 through pin 4, assuming that it does exist. In this configuration, the pin 4 is a digital output. Pin 3 of the microprocessor 76 is then set to a high impedance input to remove that connection from the circuit 86. After the capacitor 82 has had time to discharge and the circuit 86 is at steady state, pin 4 is set to an analog high impedance input. The five voltage potential applied to the resistor $R_6$ begins to charge the capacitor 82. A voltage reading is then taken at pin 4 by an 8-bit analog/digital converter 90 a predetermined period of time after the pin 4 is set to an input, to measure the voltage of the circuit 86. The predetermined period of time is less than the time it takes the capacitor 82 to fully charge and the circuit 86 to reach steady state. If the measured voltage is above a predetermined threshold when the time period has elapsed after the pin 4 is set to an analog input, then the microprocessor 76 knows that the capacitor 82 does not exist in the battery pack 62 because the voltage of the circuit 86 increased too fast. If the voltage at pin 4 is below the predetermined threshold, then the microprocessor 76 makes a determination that the capacitor 82 does exist.

Figure 7:
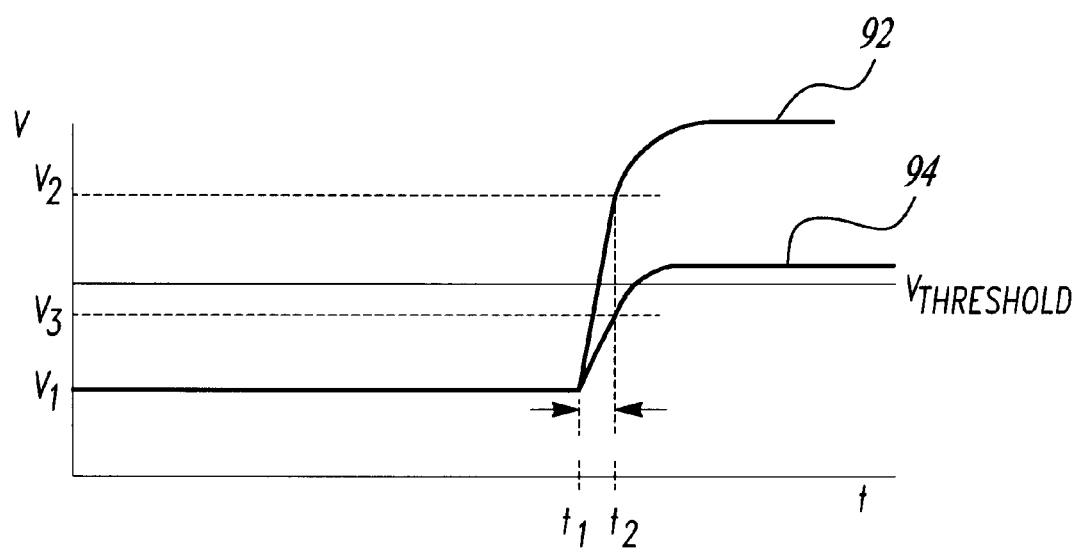
FIG. 7 is a voltage output graph for determining the presence of a capacitor in the battery monitoring circuit of FIG. 6, where voltage is on the vertical axis and time is on the horizontal axis.

For a specific example, the capacitor 82 is 10 $\mu f$ and the threshold value is 0.7V. FIG. 7 shows a graph with voltage V on the vertical axis and time t on the horizontal axis. The capacitor 82 is discharged by making pin 4 an output low as discussed above. The voltage at pin 4 is $V_1$ after the capacitor 82 is discharged and the circuit 86 is at a steady state. At time $t_1$, pin 4 is switched to an analog A/D input and the voltage at pin 4 begins to rise. At time $t_2$, here 1 ms after time $t_1$, the voltage is measured at pin 4 by the converter 90. If the capacitor 82 does not exist, as shown by graph line 92, then the voltage at pin 4 should be $V_2$ at time $t_2$, which is above the threshold. If the capacitor 82 does exist in the battery pack 62, the voltage at pin 4 should be $V_3$ at time $t_2$, which is below the threshold $V_T$ as shown by graph line 94.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

We claim:

1. A battery monitoring system for monitoring a battery pack being charged in a charging device, said monitoring system comprising:
    a battery monitoring circuit including a first voltage divider network, said first voltage divider network including a plurality of resistors;
    an identification capacitor positioned within the battery pack, said identification capacitor being electrically connected to the first voltage divider network when the battery pack is connected to the battery monitoring circuit;
    a first comparison system including a first input and a second input, said first input being connected to an output of the first voltage divider network and said second input being selectively connected to a reference voltage potential; and
    a controlling device, said controlling device charging the identification capacitor and discharging the identification capacitor through the first voltage divider network, wherein an output of the first comparison system provides a signal indicative of the value of the identification capacitor when the identification capacitor discharges through the first voltage divider network.

2. The system according to claim 1 wherein the controlling device applies a first voltage potential to one of the plurality of resistors in the first voltage divider network when the controlling device is charging the identification capacitor and applies a second voltage potential to the one resistor in the first voltage divider network when the controlling device is discharging the identification capacitor, said one of the plurality of resistors having a resistive value that is significantly lower than the values of the remaining resistors in the first voltage divider network to allow the identification capacitor to quickly discharge through the one of the plurality of resistors.

3. The system according to claim 2 wherein the first voltage divider network includes at least a first resistor, a second resistor and a third resistor, said one of the plurality of resistors being the first resistor, wherein the controlling device provides output signals to the first voltage divider network so that the first resistor and the second resistor are connected in parallel when the controlling device is charging the identification capacitor, and the first resistor and the third resistor are connected in parallel when the controlling device is discharging the identification capacitor.

4. The system according to claim 2 wherein the one of the plurality of resistors has a value that is at least two orders of magnitude less than the remaining resistors in the first voltage divider network.

5. The system according to claim 1 further comprising a temperature sensitive resistor positioned within the battery pack and forming part of the first voltage divider network when the battery pack is connected to the battery monitoring circuit, said temperature sensitive resistor acting in association with the first voltage divider network to provide a signal indicative of a temperature of the battery pack on a same line as the signal providing an indication of the battery pack identity.

6. The system according to claim 5 wherein the battery monitoring circuit further includes a second voltage divider network, said second voltage divider network including a plurality of resistors and a reference capacitor, wherein an output from the second voltage divider network is selectably connected to the second input of the first comparison system, said controlling device causing the reference capacitor to be discharged through the second voltage divider network, and wherein an output of the first comparison system provides an indication of the temperature of the battery pack as a result of a comparison between an output voltage of the first voltage divider network and an output voltage of the second voltage divider network.

7. The system according to claim 1 further comprising a voltage attenuator, said voltage attenuator being responsive to an output voltage from the battery pack and providing an attenuated voltage output, said battery monitoring system further comprising a second comparison system including a first input and a second input, said first input of the second comparison system being responsive to the attenuation voltage from the voltage attenuator, said battery monitoring circuit further including a second voltage divider network, said second voltage divider network including a reference capacitor and a plurality of resistors, wherein a voltage output from the second voltage divider network is selectively connected to the second input of the second comparison system, said second comparison system providing an output to the controlling device indicative of the attenuated voltage of the battery pack when the controlling device discharges the reference capacitor through the second voltage divider network.

8. A battery monitoring system for monitoring a battery pack being charged in a charging device, said monitoring system comprising:

a battery monitoring circuit including a first voltage divider network and a second voltage divider network, each of the first and second voltage divider networks including a plurality of resistors;

an identification capacitor positioned within the battery pack, said identification capacitor being electrically connected to the first voltage divider network when the battery pack is connected to the battery monitoring circuit;

a temperature sensitive resistor positioned within the battery pack, said temperature sensitive resistor forming part of the first voltage divider network when the battery pack is connected to the battery monitoring circuit, said temperature sensitive resistor acting in association with the first voltage divider network to provide a signal indicative of a temperature of the battery pack on a same line as the signal providing an indication of the battery pack identity;

a first comparison system including a first input and a second input, said first input being connected to an output of the first voltage divider network and said second input being selectively connected to a reference potential and an output of the second voltage divider network; and a controlling device, said controlling device charging the identification capacitor and discharging the identification capacitor through the first voltage divider network, wherein an output of the first comparison system provides a signal indicative of the value of the identification capacitor when the identification capacitor discharges through the voltage divider network, said controlling device further causing the reference capacitor to be discharged through the second voltage divider network, and wherein an output of the first comparison system further provides an indication of the temperature of the battery pack as a result of a comparison between the output voltage of the first voltage divider network and an output voltage of the second voltage divider network.

9. The system according to claim 8 wherein the controlling device applies a first voltage potential to one of the plurality of resistors in the first voltage divider network when the controlling device is charging the identification capacitor and supplies a second voltage potential to the one resistor in the first voltage divider network when the controlling device is discharging the identification capacitor, said one of the plurality of resistors having a resistive value that is significantly lower than the values of the remaining resistors in the first voltage divider network to allow the identification capacitor to quickly discharge through one of the plurality of resistors.

10. The system according to claim 9 wherein the first voltage divider network includes at least a first resistor, a second resistor and a third resistor, said one of the plurality of resistors being the first resistor, wherein the controlling device provides output signals to the first voltage divider network so that the first resistor and the second resistor are connected in parallel when the controlling device is charging the identification capacitor, and the first resistor and the third resistor are connected in parallel when the controlling device is discharging the identification capacitor.

11. The system according to claim 9 wherein the one of the plurality of resistors has a value that is at least two orders of magnitude less than the remaining resistors in the first voltage divider network.

12. The system according to claim 8 further comprising a voltage attenuator, said voltage attenuator being responsive to an output voltage from the battery pack and providing an attenuated voltage output, said battery monitoring system further comprising a second comparison system including a first input and a second input, said first input of the second comparison system being responsive to the attenuation voltage from the voltage attenuator, said battery monitoring circuit further including a second voltage divider network, said second voltage divider network including a reference capacitor and a plurality of resistors, wherein a voltage output from the second voltage divider network is selectively connected to the second input of the second comparison system, said second comparison system providing an output to the controlling device indicative of the attenuated voltage of the battery pack when the controlling device discharges the reference capacitor the second voltage divider network.

13. A system for determining the identification of a battery pack, said system comprising:

a battery pack circuit positioned within the battery pack, said battery pack being configured to be inserted into a battery pack charger, said battery pack circuit including an identification capacitor; and a battery pack monitoring circuit positioned within the battery pack charger, said battery pack monitoring circuit including a first voltage divider network that is electrically connected to the identification capacitor when the battery pack is inserted into the battery charger, said first voltage divide network including a plurality of resistors, said battery monitoring circuit providing an indication of the value of the identification capacitor upon discharge of the identification capacitor through the first voltage divider network.

14. The system according to claim 13 wherein the battery pack monitoring circuit includes means for applying a first voltage potential to one of the plurality of resistors in the first voltage divider network when the battery pack monitoring circuit is charging the identification capacitor, and for applying a second voltage potential to the one resistor in the first voltage divider network when the battery pack monitoring circuit is discharging the identification capacitor, said one of the plurality of resistors having a resistive value that is significantly lower than the values of the remaining resistors in the first voltage divider network to allow the identification capacitor to quickly discharge through the one of the plurality of resistors.

15. The system according to claim 13 wherein the battery pack circuit further includes a temperature sensitive resistor electrically connected to the identification capacitor and forming part of the first voltage divider network when the battery pack is connected to the battery pack monitoring circuit, said temperature sensitive resistor acting in association with the first voltage divider network to provide a signal indicative of a temperature of the battery pack on a same line as the signal providing an indication of the battery pack identity.

16. The system according to claim 15 wherein the battery monitoring circuit further includes a second voltage divider network, said second voltage divider network including a plurality of resistors and a reference capacitor, said battery monitoring circuit charging and discharging the reference capacitor through the second voltage divider network, wherein the battery pack monitoring circuit provides an indication of the temperature of the battery pack based on a result of the comparison between an output voltage of the first voltage divider network and an output voltage of the second voltage divider network.

17. A rechargeable battery pack including a plurality of battery cells, said battery pack being configured to be inserted into a battery charger to charge the battery cells, said battery pack further including a unique identification capacitor having a predetermined value, said battery charger being operable to determine the value of the identification capacitor based on a discharge rate of the identification capacitor.

18. The battery pack according to claim 17 further comprising a temperature sensitive resistor, said battery charger further being operable to determine the temperature of the battery pack based on a resistive value of the temperature sensitive resistor.

19. A method of determining the identity of a battery pack, said method comprising the steps of:
   discharging a potential capacitive component of a battery pack circuit of the battery pack;
   initiating recharging of the potential capacitive component after the capacitive component is substantially discharged;
   waiting a predetermined period of time after initiating the recharging of the potential capacitive component; and
   measuring a voltage output of the battery pack circuit after the predetermined period of time to determine whether the voltage output is above or below a predetermined threshold value.

20. The method according to claim 19 wherein the step of measuring a voltage output includes determining that the battery pack circuit does not include the potential capacitive component if the value output is above the threshold value and determining that the battery pack circuit does include the potential capacitive component if the voltage output is below the threshold value.

21. The method according to claim 19 wherein the step of measuring the voltage output includes using an analog-to-digital converter to measure the voltage output.

22. The method according to claim 19 wherein the predetermined time period is 1 ms.

23. The method according to claim 19 wherein the predetermined threshold value is 0.7 volts.

24. The method according to claim 19 wherein the step of discharging the potential capacitive component includes setting an analog/digital input/output of a microprocessor to a digital output low, and the step of initiating recharging of the potential capacitive component includes setting the analog/digital input/output to an analog input, said step of measuring a voltage output of the battery pack circuit includes measuring the voltage output at the analog input.

25. The method according to claim 19 further comprising the step of determining if the battery pack includes a potential temperature dependent resistive element.

26. The method according to claim 25 wherein the step of determining if the battery pack circuit includes a potential resistive element includes the step of determining the voltage output of a voltage divider network, where the resistive element is part of the voltage divider network.

27. The method according to claim 26 further comprising the step of determining the resistance of the resistive element if it is determined that the potential resistive element exists based on the voltage output of the divider network.

28. The method according to claim 27 wherein the voltage output of the divider network is determined by an analog-to-digital converter.

29. A method of determining the identity of a battery pack, said method comprising the steps of:
   determining whether a battery pack circuit of the battery pack includes a potential temperature dependent resistive element by determining the voltage output of a voltage divider network, where the resistive element is part of the voltage divider network;
   discharging a potential capacitive component of the battery pack circuit;
   initiating recharging of the potential capacitive component after the capacitive component is substantially discharged;
   waiting a predetermined period of time after the step initiating the recharging of the potential capacitive component; and
   measuring a voltage output of the battery pack circuit to determine whether the voltage output is above a predetermined threshold value, said step of measuring the voltage output includes determining that the battery pack circuit does not include the potential capacitive component if the voltage output is above the threshold value and determining that the battery pack circuit does include the potential capacitive component if the voltage output is below the threshold value.

30. The method according to claim 29 wherein the step of measuring the voltage output includes using an analog-to-digital converter to measure the voltage output.

31. The method according to claim 29 wherein the predetermined time period is 1 ms.

32. The method according to claim 29 wherein the predetermined threshold value is 0.7 volts.

33. The method according to claim 29 wherein the step of discharging a potential capacitive component includes setting an analog/digital input/output of a microprocessor to a digital output low, and the step of initiating recharging of the potential capacitive component includes setting the analog/digital input/output to an analog input, said step of measuring a voltage output of the battery pack circuit includes measuring the voltage output at the analog input.

34. The method according to claim 29 further comprising the step of determining the resistance of the resistive element if it is determined that the potential resistive element exists based on the voltage output of the divider network.

* * * * *